United States Patent
Mizuno

(10) Patent No.: US 12,293,904 B2
(45) Date of Patent: May 6, 2025

(54) SUBSTRATE PROCESSING APPARATUS, SUBSTRATE PROCESSING METHOD, GAS REGENERATION SYSTEM, AND GAS REGENERATION METHOD

(71) Applicant: Kioxia Corporation, Tokyo (JP)

(72) Inventor: Horoyuki Mizuno, Kuwana (JP)

(73) Assignee: Kioxia Corporation, Tokyo (JP)

( * ) Notice: Subject to any disclaimer, the term of this patent is extended or adjusted under 35 U.S.C. 154(b) by 897 days.

(21) Appl. No.: 17/465,115

(22) Filed: Sep. 2, 2021

(65) Prior Publication Data

US 2022/0285141 A1 Sep. 8, 2022

(30) Foreign Application Priority Data

Mar. 4, 2021 (JP) ................................ 2021-034727

(51) Int. Cl.
*H01J 37/32* (2006.01)
*H01L 21/3213* (2006.01)

(52) U.S. Cl.
CPC .... *H01J 37/32844* (2013.01); *H01J 37/3244* (2013.01); *H01J 37/32495* (2013.01); *H01L 21/32136* (2013.01)

(58) Field of Classification Search
None
See application file for complete search history.

(56) References Cited

U.S. PATENT DOCUMENTS

| | | | | |
|---|---|---|---|---|
| 6,217,633 | B1 * | 4/2001 | Ohmi ..................... | B01D 53/00 96/111 |
| 6,605,134 | B2 * | 8/2003 | Ishihara ................. | B01D 53/22 96/111 |
| 7,371,690 | B2 | 5/2008 | Negishi et al. | |
| 2003/0228989 | A1 * | 12/2003 | Ezell ..................... | B01D 53/04 257/E21.252 |
| 2007/0079849 | A1 * | 4/2007 | Hogle .................. | C23C 16/4405 134/10 |
| 2010/0264117 | A1 | 10/2010 | Ohmi et al. | |
| 2016/0086831 | A1 | 3/2016 | Rivera et al. | |
| 2019/0252157 | A1 | 8/2019 | Moyama et al. | |

FOREIGN PATENT DOCUMENTS

| | | | |
|---|---|---|---|
| JP | 4538209 | B2 | 9/2010 |
| JP | 5231441 | B2 | 7/2013 |
| JP | 2015203145 | * | 4/2014 |
| JP | 2015-203145 | A | 11/2015 |
| JP | 2019-140238 | A | 8/2019 |
| TW | 473456 | B | 1/2002 |
| TW | I288656 | B | 10/2007 |

* cited by examiner

*Primary Examiner* — Tuan N Nguyen
(74) *Attorney, Agent, or Firm* — Oblon, McClelland, Maier & Neustadt, L.L.P.

(57) ABSTRACT

According to one embodiment, there is provided a gas regeneration method. The method includes setting a predetermined standard on a basis of a flow rate of rare gas set in a processing recipe. The method includes selecting a rare gas recovery step on a basis of the predetermined standard. The method includes, in the rare gas recovery step, guiding emission gas from a predetermined chamber to a rare gas regenerator. The method includes, in a step other than the rare gas recovery step, causing the emission gas to bypass the rare gas regenerator to discharge the emission gas.

10 Claims, 6 Drawing Sheets

FIG.2 RP

| PROCESSING STEP NO. | PROCESSING STEP NAME | TIME [SEC.] | Kr FLOW RATE [sccm] | TOTAL FLOW RATE [sccm] | Kr RATIO [%] | USAGE [cc] | UTILIZATION RATE [%] |
|---|---|---|---|---|---|---|---|
| 1 | Stability | 7 | 100 | 400 | 25 | 12 | 0.6 |
| 2 | Strike | 2 | 100 | 400 | 25 | 3 | 0.2 |
| 3 | Transition1 | 6 | 100 | 400 | 25 | 10 | 0.5 |
| 4 | ME1 | 100 | 100 | 500 | 20 | 167 | 8.3 |
| 5 | Transition2 | 8 | 100 | 500 | 20 | 13 | 0.7 |
| 6 | ME2 | 120 | 100 | 500 | 20 | 200 | 10.0 |
| 7 | Transition3 | 10 | 50 | 400 | 13 | 8 | 0.4 |
| 8 | ME3 | 150 | 50 | 250 | 20 | 125 | 6.3 |
| 9 | Transition4 | 10 | 50 | 250 | 20 | 8 | 0.4 |
| 10 | ME4 | 1000 | 50 | 250 | 20 | 833 | 41.7 |
| 11 | Transition5 | 10 | 100 | 500 | 20 | 17 | 0.8 |
| 12 | ME5 | 100 | 100 | 500 | 20 | 167 | 8.3 |
| 13 | Transition6 | 10 | 20 | 400 | 5 | 3 | 0.2 |
| 14 | ME6 | 400 | 20 | 400 | 5 | 133 | 6.7 |
| 15 | Transition7 | 5 | 50 | 400 | 13 | 4 | 0.2 |
| 16 | ME7 | 150 | 50 | 400 | 13 | 125 | 6.3 |
| 17 | Transition8 | 5 | 50 | 450 | 11 | 4 | 0.2 |
| 18 | OE | 200 | 50 | 450 | 11 | 167 | 8.3 |
| 19 | Transition9 | 5 | 0 | 450 | 0 | 0 | 0.0 |
| 20 | Dechuck | 3 | 0 | 450 | 0 | 0 | 0.0 |

TOTAL USAGE: 2000 [cc]

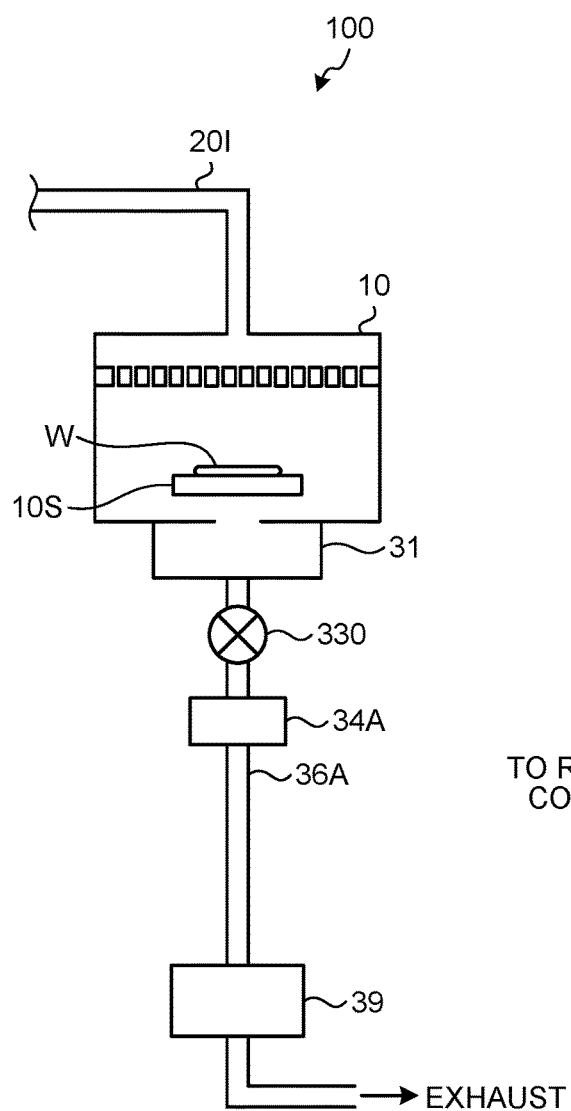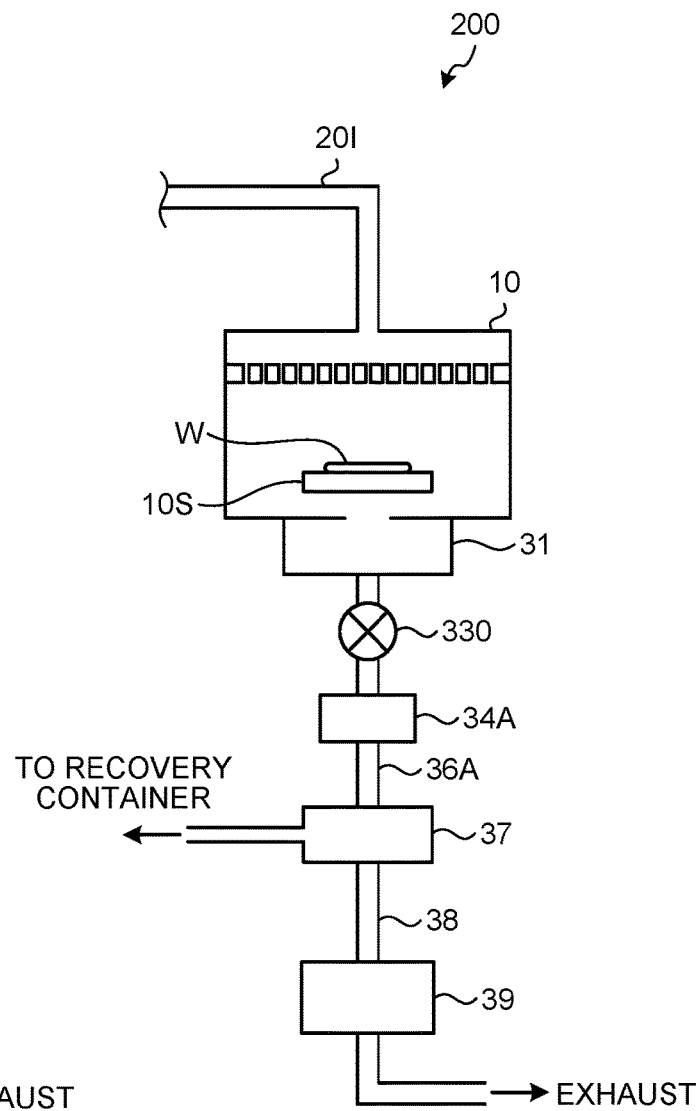

SUBSTRATE PROCESSING APPARATUS, SUBSTRATE PROCESSING METHOD, GAS REGENERATION SYSTEM, AND GAS REGENERATION METHOD

CROSS-REFERENCE TO RELATED APPLICATIONS

This application is based upon and claims the benefit of priority from Japanese Patent Application No. 2021-034727, filed on Mar. 4, 2021; the entire contents of which are incorporated herein by reference.

FIELD

Embodiments described herein relate generally to a substrate processing apparatus, a substrate processing method, a gas regeneration system, and a gas regeneration method.

BACKGROUND

One of semiconductor device fabrication processes is, for example, an etching process for forming a predetermined pattern on a semiconductor substrate such as a silicon wafer. In the etching process, etching gas is used according to a material to be etched. Further, together with the etching gas, nitrogen gas or hydrogen gas is used, for example, as dilution gas or auxiliary gas.

In recent years, rare gas such as krypton (Kr) gas and xenon (Xe) gas has also tended to be used together with the etching gas and so on. The gas exists in trace amounts in nature and is difficult to be synthesized. For this reason, the rare gas tends to be expensive and can even be difficult to obtain as compared to nitrogen gas that exists in large quantities in nature or hydrogen gas that can be synthesized. To address this, for example, a gas regenerator is used to separate rare gas from gas discharged from an etching chamber, and the rare gas is recovered and then reused. The initial cost and maintenance cost of a gas regenerator may increase because a large gas regenerator is required depending on the amount of emission gas or maintenance of the gas regenerator involves much money and effort.

BRIEF DESCRIPTION OF THE DRAWINGS

FIG. 2 is a diagram illustrating an example of a processing recipe;

FIG. 4A is a schematic view illustrating a substrate processing apparatus according to a first comparative example, and FIG. 4B is a schematic view illustrating a substrate processing apparatus according to a second comparative example;

DETAILED DESCRIPTION

In general, according to one embodiment, there is provided a gas regeneration method. The method includes setting a predetermined standard on a basis of a flow rate of rare gas set in a processing recipe. The method includes selecting a rare gas recovery step on a basis of the predetermined standard. The method includes, in the rare gas recovery step, guiding emission gas from a predetermined chamber to a rare gas regenerator. The method includes, in a step other than the rare gas recovery step, causing the emission gas to bypass the rare gas regenerator to discharge the emission gas.

Exemplary embodiments of substrate processing apparatus, substrate processing method, gas regeneration system, and gas regeneration method will be explained below in detail with reference to the accompanying drawings. The present invention is not limited to the following embodiments. In all the accompanying drawings, members and components that are identical or correspond to each other are denoted by identical or corresponding reference symbols, and the redundant description will not be repeated. Further, the purpose of the drawings is not to illustrate a relative ratio between members, components, or thicknesses of various layers, and therefore specific thicknesses and dimensions may be determined by those skilled in the art in light of the non-limiting embodiments described below.

Embodiment

Figure 1:
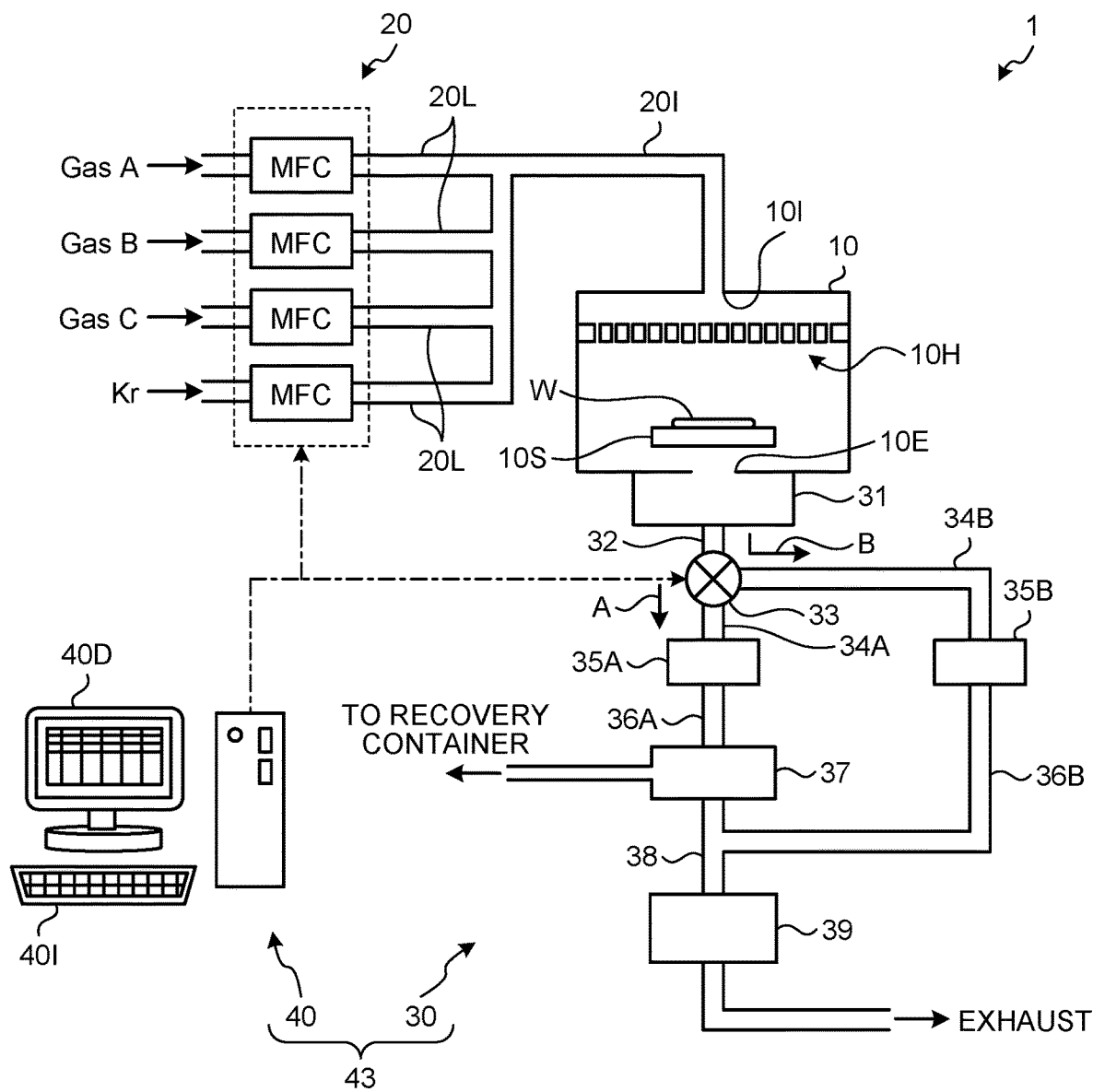
FIG. 1 is a schematic diagram illustrating a substrate processing apparatus according to an embodiment.

FIG. 1 is a schematic diagram illustrating a substrate processing apparatus according to an embodiment. In this embodiment, an example of the substrate processing apparatus is an etching device. As illustrated in FIG. 1, a substrate processing apparatus 1 according to this embodiment includes a chamber 10 configured to accommodate a semiconductor wafer as a substrate to be processed, a gas supply system 20 for supplying processing gas to the chamber, a gas exhaust system 30 for discharging gas of the chamber, and a controller 40 for collectively controlling the substrate processing apparatus 1.

The chamber 10 includes a support table 10S on which a semiconductor wafer W (hereinafter, referred to as a "wafer W" simply) as the substrate to be processed is placed. The support table 10S may have, for example, a heater (not illustrated) which allows the wafer W placed on the support table 10S to be heated to a predetermined temperature. The chamber 10 also includes a shower head 10H for supplying the processing gas, which is supplied in the inner space, uniformly to the wafer W on the support table 10S. The support table 10S and the shower head 10H may be a lower electrode and an upper electrode respectively to which radio frequency power is supplied. In such a case, the chamber 10 can be used as a plasma etching chamber. The chamber 10 is made of aluminum, for example. Further, in a case where plasma is used, the inner surface of the chamber 10 may be coated with a material having high plasma resistance such as alumina ($Al_2O_3$) or yttria ($Y_2O_3$). The chamber 10 has, on its side wall, an opening through which the wafer W is carried into and out of the chamber 10, and a load-lock chamber may be attached through a gate valve (both not illustrated) to the opening. Further, the chamber 10 is provided with a supply port 10I and an exhaust port 10E for processing gas.

The gas supply system 20 may have, for example, a gas supply pipe 20I connected to the supply port 10I of the chamber 10, a plurality of gas pipes 20L merging into the gas supply pipe 20I, and a gas supply source (not illustrated) that is connected to the gas pipes 20L and is capable of supplying predetermined gas to each of the gas pipes 20L. The gas pipes 20L are provided with a flow rate controller MFC such as a mass flow meter. The gas supply source supplies a plurality of kinds of gas to the gas pipes 20L, and the gas flows in the gas pipes 20L under flow rate control by the flow rate controller MFC and are introduced from the gas supply pipe 20I to the chamber 10. In FIG. 1, "Gas A" may be etching gas and "Gas B" may be dilution gas, for example. The etching gas may be appropriately determined depending on an object to be etched, and the dilution gas may be hydrogen ($H_2$) gas or nitrogen ($N_2$) gas. In a case where a plurality of etching gas is used, "Gas C" may be another etching gas. In a case where oxygen ($O_2$) gas is used as the auxiliary gas for the etching gas as "Gas A", "Gas C" may be $O_2$ gas. Further, in the following description, Kr gas is exemplified as the rare gas; however, instead of Kr gas, xenon (Xe) gas, helium (He) gas, neon (Ne) gas, argon (Ar) gas, and radon (Rn) gas may be used. Note that gas supplied to the chamber 10, for example, etching gas, rare gas, dilution gas, another etching gas, and auxiliary gas are sometimes collectively referred to as the processing gas.

The gas exhaust system 30 includes a turbo molecular pump 31 attached to an exhaust port of the chamber 10. The turbo molecular pump 31 is connected to an exhaust pipe 32 which has a flow path changeover valve 33. The flow path changeover valve 33 has one intake port and two exhaust ports, and the intake port is connected to the exhaust pipe 32. One of the exhaust ports is connected to an exhaust pipe 34A and the other exhaust port is connected to an exhaust pipe 34B. The flow path changeover valve 33 selectively establishes a flow path A extending from the exhaust pipe 32 to the exhaust pipe 34A and a flow path B extending from the exhaust pipe 32 to the exhaust pipe 34B.

The exhaust pipes 34A and 34B are connected to dry pumps 35A and 35B functioning as auxiliary pumps of the turbo molecular pump 31, respectively. The dry pump 35A has an exhaust port connected to an exhaust pipe 36A which is connected to a gas regenerator 37. The gas regenerator 37 is provided to separate Kr gas from gas discharged from the chamber 10, and may use, for example, pressure swing adsorption (PSA), temperature swing adsorption (TSA), vacuum pressure swing adsorption (VPSA), gas chromatography (GC-Mass), or other methods. Alternatively, it is possible to use a gas regenerator with adsorption method using a hollow fiber membrane or a membrane, or to use a gas regenerator with cryogenic distillation method for separating gas on the basis of differences in liquefaction temperature. Yet alternatively, the gas regenerator 37 may be configured by combining two types or more of the gas regenerators.

The gas regenerator 37 has an exhaust port connected to an exhaust pipe 38. An exhaust pipe 36B extending from the dry pump 35B joins the exhaust pipe 38. Unlike the exhaust pipe 36A, the exhaust pipe 36B has no gas regenerator. The exhaust pipe 38 is connected to a detoxification device 39 for processing the gas discharged from the chamber 10.

The configuration described above allows the gas discharged from the chamber 10 to pass through the turbo molecular pump 31, the dry pump 35A, and the gas regenerator 37 to flow into the detoxification device 39 in a case where the flow path changeover valve 33 establishes the flow path A. At this time, Kr gas separated, by the gas regenerator 37, from the emission gas is filled in a predetermined recovery container (not illustrated) and is used again. Alternatively, in a case where the flow path changeover valve 33 establishes the flow path B, the gas discharged from the chamber 10 passes through the turbo molecular pump 31 and the dry pump 35B to flow into the detoxification device 39. The detoxification device 39 removes, for example, harmful components contained in the emission gas and emits the residual gas to the atmosphere.

The controller 40 can be implemented as a computer including a central processing unit (CPU), a read only memory (ROM), and a random access memory (RAM). Alternatively, the controller 40 may be implemented by hardware such as an application specific integrated circuit (ASIC), a programmable gate array (PGA), or a field programmable gate array (FPGA). Further, the controller 40 includes a display unit 40D such as a display device and an input unit 40I such as a keyboard. The display unit 40D displays, thereon, a processing recipe (or recipe, simply) and the input unit 40I receives an input, into an entry field of the recipe, of process parameters including a flow rate of processing gas (etching gas, auxiliary gas, rare gas, dilution gas, and so on), a pressure in the chamber 10, a temperature of the support table 10S, and a time of each processing step. The controller 40 sends a command signal, for example, to the flow rate controller MFC, the flow path changeover valve 33, the turbo molecular pump 31, the dry pumps 35A and 35B on the basis of the recipe. In other words, the controller 40 controls each control device on the basis of the recipe, and causes the substrate processing apparatus 1 to execute a substrate processing method described later, for example. The controller 40 and the gas exhaust system 30 constitute a gas regeneration system 43.

The recipe is a program that can set, in the form of table, the order of steps of a process and process parameters (temperature, pressure, type of gas, gas flow rate, and time) in each step so that the individual control devices (flow rate controller, pressure controller, temperature regulator, and so on) of the substrate processing apparatus are controlled through the controller 40. The processing recipe (and various types of data related thereto) is downloadable, via wired or wireless, to the controller 40, for example, from a non-transitory computer readable storage medium such as a hard disk drive (HDD), a semiconductor memory, or a server. The process parameters may be changed appropriately at the start of the process.

FIG. 2 is a diagram illustrating an example of the recipe, and the recipe is displayed on the display unit 40D of the controller 40. The illustrated recipe RP is, for example, a recipe for a substrate processing method (specifically, etching process) and Kr gas is used as the rare gas. As illustrated, set values of time (second) and Kr flow rate (sccm) are entered for each processing step. However, in FIG. 2, process parameters are omitted which include a flow rate of etching gas, dilution gas, and the like, a pressure in the chamber 10, a temperature of the wafer W, and radio frequency power supplied to the electrodes (shower head 10H and support table 10S) in the chamber 10, for the convenience of explanation. Further, a total flow rate in the recipe RP is a sum of the flow rate of the processing gas (etching gas, auxiliary gas, Kr gas, and dilution gas) supplied to the chamber 10, and the total flow rate is automatically displayed in response to the set values entered. A Kr ratio indicates a ratio of the Kr gas flow rate to the total flow rate in each step, usage is Kr gas usage (flow rate×time) in each step, and a utilization rate is usage of Kr gas in each step relative to total usage of Kr gas used throughout the process. The KR ratio and the utilization rate may be also displayed automatically on the basis of the set values.

According to the recipe RP, in processing Step No. 6 for example, Kr gas is supplied to the chamber 10 for 120 seconds at a flow rate of 100 sccm. The usage at this time is 200 cc (100 sccm×120 seconds/60 seconds), and the proportion of the Kr gas flow rate to the total flow rate of 500 sccm in the processing step is 20%. Further, in processing Step No. 10 for example, Kr gas is supplied to the chamber 10 for 1000 seconds (16 minutes 40 seconds) at a flow rate of 50 sccm. The usage at this time is 833 cc, and the proportion of the Kr gas flow rate to the total flow rate of 250 sccm in the processing step is 41.7%. On the other hand, in processing Steps No. 19 and 20, no Kr gas is supplied (set value=0 (zero)).

In the case of the Kr gas flow rate set as indicated, the total usage of Kr gas is 2000 cc (2 liters) in the entire process. In processing Step No. 1 for example, only 0.6% of Kr gas is used relative to the total usage, while 41.7% of Kr gas is used relative to the total usage in processing Step No. 10. Since the processing step name of processing Step No. 1 is "stability", the processing is carried out to stabilize the flow rate of processing gas, and, in processing Step No. 10 (processing step name: ME4), the etching process is actually carried out. As described above, the Kr gas usage for each processing step in one process varies greatly depending on the process actually carried out in the processing step.

Figure 3:
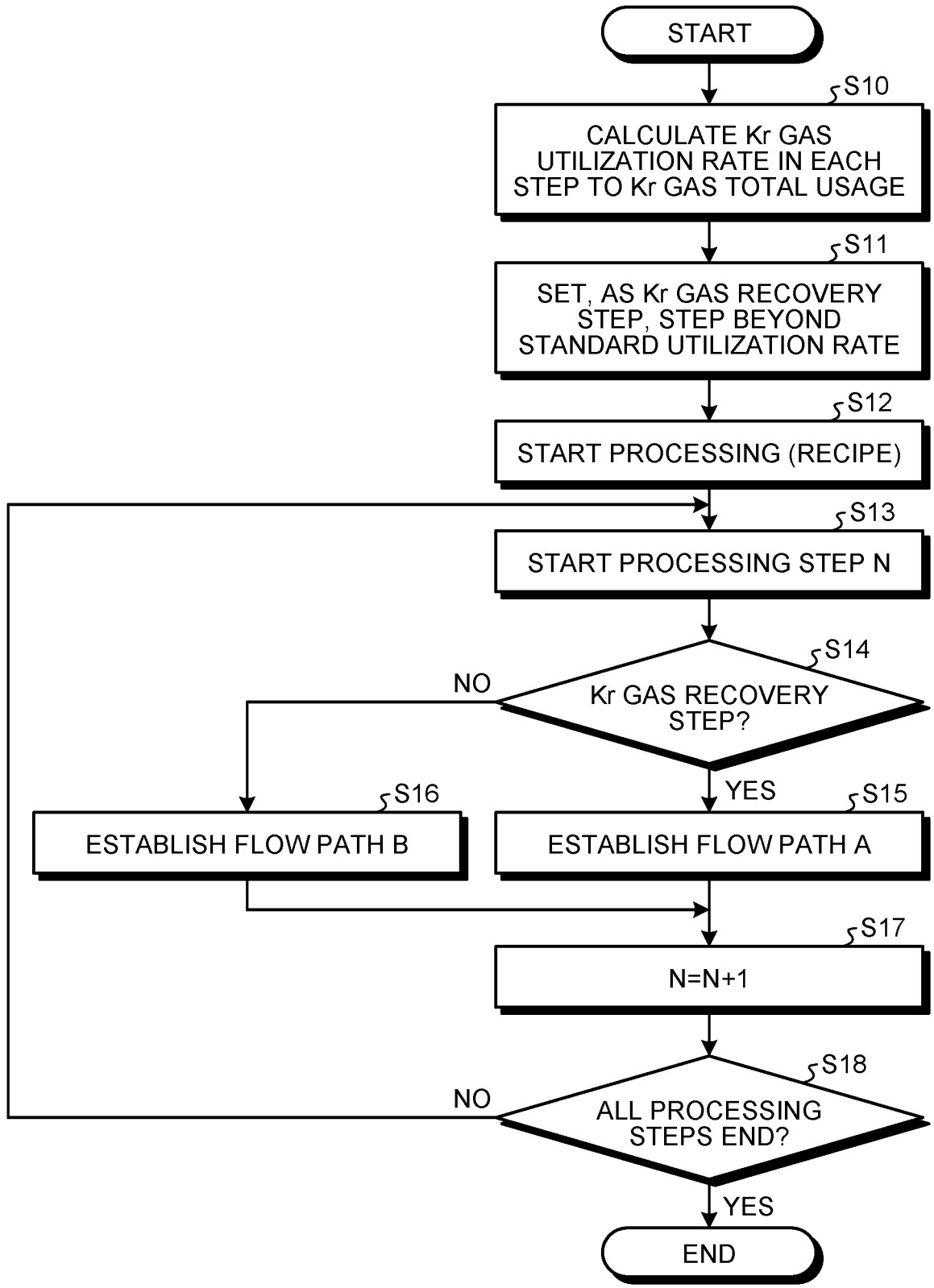
FIG. 3 is a flowchart for depicting a substrate processing method according to this embodiment.

The description goes on to a substrate processing method according to this embodiment with reference to FIG. 3 by taking an example in which the substrate processing method is applied to the substrate processing apparatus 1 illustrated in FIG. 1 on the basis of the recipe RP of FIG. 2. FIG. 3 is a flowchart for depicting the substrate processing method according to this embodiment. In Step S10, first, total usage of Kr gas supplied to the chamber 10 for each processing step of the recipe RP is calculated. Specifically, Kr gas usage for each step is calculated on the basis of a Kr gas flow rate set for each step and a time required for the step. Then, the results are added up to determine the total usage of Kr gas. In the example of recipe RP, the total usage of Kr gas is 2000 cc as indicated in FIG. 2. Subsequently, for each processing step, a utilization rate of the usage to the total usage is determined (see FIG. 2).

Subsequently, in Step S11, a standard utilization rate is set. The standard utilization rate may be appropriately determined, for example, on the basis of the proportion of Kr gas to be recovered out of the total usage of Kr gas (target recovery rate). For example, in the recipe RP, more than 41% of the total usage of Kr gas is used in processing Step No. 10. Further, in processing Step No. 6 and processing Step No. 10, in total, more than 51% of the total usage of Kr gas is used. Further, if processing Steps No. 4, 12, and 18 are added to processing Steps No. 6 and 10, then more than 77% of the total usage of Kr gas is to be used in the five processing Steps (Nos. 4, 6, 10, 12, and 18). Furthermore, if processing Steps No. 8, 14, and 16 are added thereto, then more than 96% of the total usage of Kr gas is used in the eight processing Steps (Nos. 4, 6, 8, 10, 12, 14, 16, and 18).

In light of the above, for example, in a case where about 41% of Kr gas should be recovered, 40% can be set as the standard utilization rate for example in consideration of 41% that is the utilization rate in the processing Step No. 10. Alternatively, for example, in a case where about 52% of Kr gas should be recovered, 9% can be set as the standard utilization rate for example in consideration of 10% that is the utilization rate in the processing Step No. 6. Yet alternatively, in a case where Kr gas up to 77% should be recovered, 8% can be set as the standard utilization rate for example in consideration of 8.3% that is the utilization rate in the processing Steps No. 5 and 12. Yet alternatively, in a case where Kr gas up to 96% should be recovered, can be set as the standard utilization rate for example in consideration of 6.3% that is the utilization rate in the processing Steps No. 8 and 16.

After that, in Step S12, the substrate processing apparatus 1 starts a process on the basis of the recipe RP. The wafer W (FIG. 1), which is a substrate to be processed, is assumed to be carried into the chamber 10 at least before the start of the process and placed on the support table 10S. Further, in the recipe RP, a flow rate of etching gas or dilution gas, a pressure in the chamber 10, a temperature of the wafer W, and radio frequency power supplied to the electrodes in the chamber 10 are also set and the controller 40 outputs a command signal to the control devices of the substrate processing apparatus 1 on the basis of the settings in the recipe RP, and the process is carried out on the wafer W.

When the processing Step No. N (N is an integer of 1 to 20 in the case of the recipe RP) starts (Step S13), it is determined whether or not the processing Step No. N corresponds to a Kr gas recovery step (Step S14). In other words, it is determined whether or not the utilization rate in the processing Step No. N is equal to or greater than the standard utilization rate. If it is determined that the processing Step No. N corresponds to the Kr gas recovery step (Step S14: Yes), that is, if the utilization rate in the processing Step No. N is equal to or greater than the standard utilization rate, then the flow path changeover valve 33 establishes the flow path A (FIG. 1). To be specific, the processing gas supplied into the chamber 10 contributes to etching on the wafer W in the chamber 10, is discharged from the turbo molecular pump 31, and then is guided from the dry pump 35A to the gas regenerator 37. This allows, in the processing Step No. N, the gas regenerator 37 to recover Kr gas contained in the emission gas from the chamber 10 and to fill the Kr gas in the recovery container (not illustrated). On the other hand, the residual emission gas is released into the atmosphere through the detoxification device 39.

On the other hand, if it is determined that the processing Step No. N does not correspond to the Kr gas recovery step (Step S14: No), that is, if the utilization rate in the processing Step No. N is smaller than the standard utilization rate, then the flow path changeover valve 33 establishes the flow path B (FIG. 1). To be specific, the processing gas supplied into the chamber 10 is discharged from the turbo molecular pump 31, and passes through the dry pump 35B to the detoxification device 39. In other words, the emission gas sent from the chamber 10 is caused to bypass the gas regenerator 37 to flow into the detoxification device 39; therefore, Kr gas is not separated.

For example, in a case where the standard utilization rate is set at 8%, in the recipe RP, the processing Steps No. 4, 6, 10, 12, and 18 where the utilization rate exceeds the standard utilization rate of 8% correspond to the Kr gas recovery step. To be specific, in the processing Steps No. 4, 6, 10, 12, and 18, the flow path A is established and the emission gas is guided to the gas regenerator 37. In steps other than the processing Steps No. 4, 6, 10, 12, and 18, the flow path B is established and the emission gas is caused to bypass the gas regenerator 37.

When one processing Step No. N ends, the process goes on to the next processing Step No. N+1 (Step S17) and it is determined whether or not all the processing steps end (Step S18). If it is determined that all the processing steps have yet to end (Step S18: No), then the process returns to Step S13 and the process from Step S13 to Step S17 is repeated until all the processing steps end. If it is determined that all the processing steps end (Step S18: Yes), then the process ends.

The description goes on to effects produced by the substrate processing apparatus 1 and the substrate processing method according to this embodiment with reference to FIGS. 4A and 4B. FIG. 4A is a schematic view illustrating a substrate processing apparatus according to a first comparative example, and FIG. 4B is a schematic view illustrating a substrate processing apparatus according to a second comparative example. Referring to FIG. 4A, a substrate processing apparatus 100 according to the first comparative example includes an on-off valve 330 different from the flow path changeover valve 33 of the substrate processing apparatus 1 according to this embodiment. The on-off valve 330 has one intake port and one exhaust port, and has neither an exhaust pipe corresponding to the exhaust pipe 34B nor an auxiliary pump corresponding to the dry pump 35B in the embodiment. To be specific, when the on-off valve 330 opens, a flow path extending from the turbo molecular pump 31 to the dry pump 35A is established. Further, the exhaust pipe 36A of the dry pump 35A is directly connected to the intake port of the detoxification device 39, and the exhaust pipe 36A does not have a gas generator corresponding to the gas regenerator 37 in the embodiment. The other configurations of the substrate processing apparatus 100 including the gas supply system and the chamber 10 are similar to those of the substrate processing apparatus 1.

Referring next to FIG. 4B, a substrate processing apparatus 200 according to the second comparative example also includes the on-off valve 330, and a flow path extending from the turbo molecular pump 31 to the dry pump 35A is established. Further, the substrate processing apparatus 200 according to the second comparative example is different from the substrate processing apparatus 100 according to the first comparative example, and the exhaust pipe 36A of the dry pump 35A is connected to the gas regenerator 37. Thus, gas discharged from the chamber 10 always flows through the gas regenerator 37 where Kr gas is separated and recovered. The other configurations of the substrate processing apparatus 200 including the gas supply system and the chamber 10 are similar to those of the substrate processing apparatus 1.

In the substrate processing apparatus 100 according to the first comparative example, for example, in a case where the substrate processing method is executed on the basis of a predetermined recipe, it is difficult to separate Kr gas from gas discharged from the chamber 10 and to recover the Kr gas. This can lead to the need to purchase a large amount of Kr gas, which exists in a small amount in nature and tends to be expensive. On the other hand, in the substrate processing apparatus 200 according to the second comparative example, Kr gas is always separated from gas discharged from the chamber 10 and the KR gas is recovered. In short, the gas regenerator 37 always operates. This may increase the power consumption, the maintenance frequency of the gas regenerator 37, and the maintenance cost thereof. Further, using a large gas regenerator can reduce the maintenance frequency thereof; however, in the case of a gas regenerator with adsorption method, such a gas regenerator may need a large initial cost and a large running cost.

In contrast, according to the substrate processing apparatus 1 and the substrate processing method of this embodiment, a Kr gas utilization rate in each processing step is determined on the basis of the recipe RP, and in a case where the flow path changeover valve 33 establishes the flow path A in a processing step (Kr gas recovery step) where the utilization rate is equal to or greater than a predetermined standard utilization rate, Kr gas is recovered. In other words, since Kr gas is recovered in the Kr gas recovery step, the gas regenerator 37 operates substantially in the Kr gas recovery step, and is almost in a standby state in processing steps other than the Kr gas recovery step. This prevents unnecessary increase in power consumption of the gas regenerator 37 and unnecessary increase in frequency of maintenance thereof. On the other hand, in processing steps other than the Kr gas recovery step, Kr gas is released without being separated and recovered; however, it is still possible to separate and recover a significant amount of Kr gas of the total usage. In other words, according to the substrate processing apparatus 1 and the substrate processing method of this embodiment, Kr gas can be separated and recovered in a processing step where usage of Kr gas increases without keeping the gas regenerator 37 running; resulting in reduction in initial cost, maintenance cost, and so on of the gas regenerator 37 in consideration of the purchase cost of Kr gas.

(First Modification)

Figure 5:
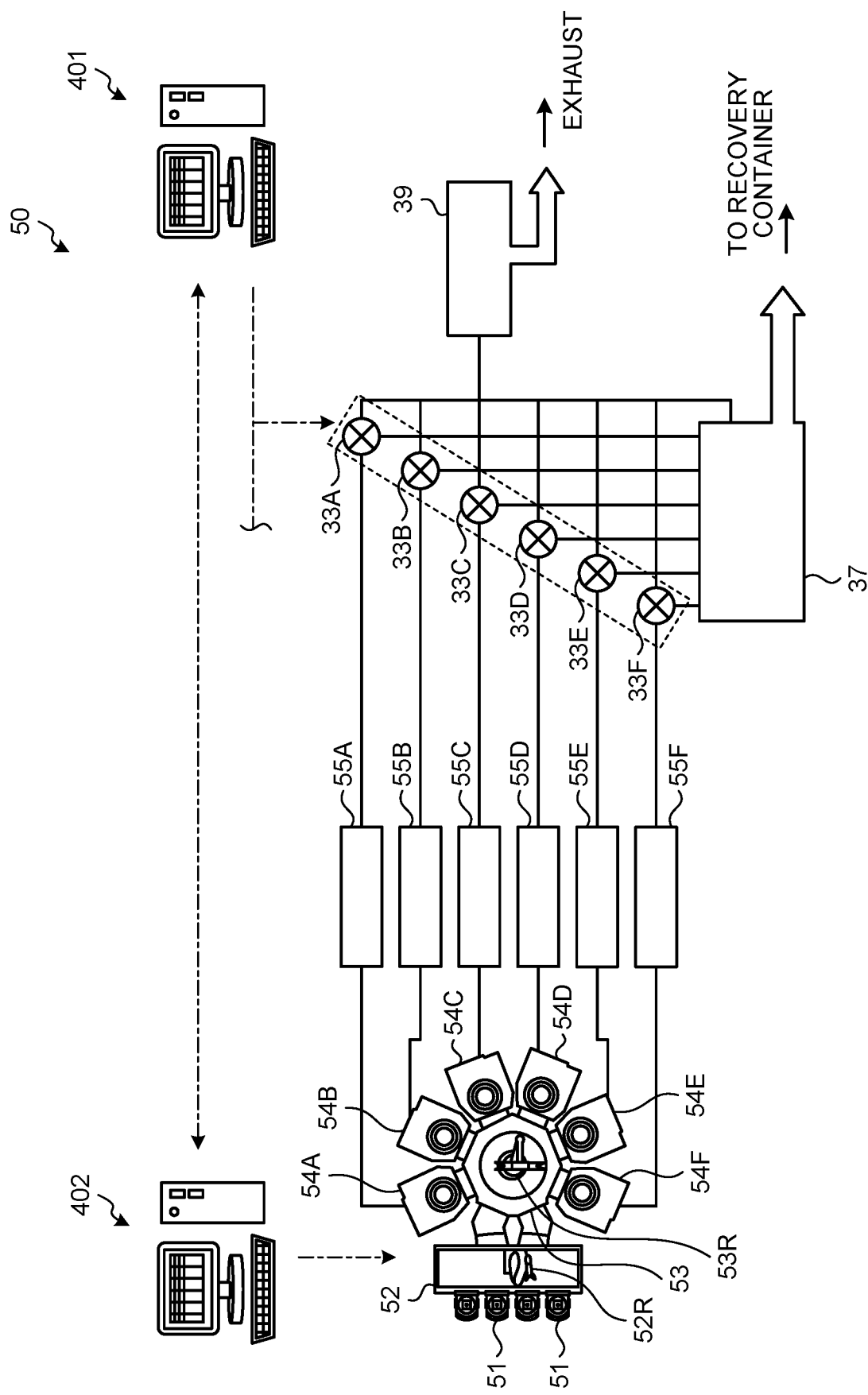
FIG. 5 is a schematic diagram illustrating a substrate processing apparatus according to a first modification.

The description goes on to a modification to the substrate processing apparatus 1 according to this embodiment. FIG. 5 is a schematic diagram illustrating a substrate processing apparatus 50 according to a first modification. As illustrated, the substrate processing apparatus 50 is a so-called cluster tool having a plurality of chambers 54A to 54F. The substrate processing apparatus 50 includes a plurality of tables 51 on which a front opening unified pod (FOUP) is placed and the FOUP placed on the table 51 is hermetically connected to a load-lock chamber 52. The load-lock chamber 52 is provided with a pump (not illustrated), which can keep the inside of the load-lock chamber 52 under a reduced pressure. The load-lock chamber 52 is also provided with a transfer robot 52R, which enables passing and receiving of a wafer between the FOUP and a transfer robot 53R described below. Further, the load-lock chamber 52 is hermetically connected to a transfer chamber 53 through a predetermined passage.

The transfer chamber 53 has a polygonal shape in plan view, and has sides connected to the chambers 54A to 54F via gate valves (not illustrated). The transfer chamber 53 is connected to a vacuum pump (not illustrated), which can keep the inside of the transfer chamber 53 under a reduced pressure. The transfer chamber 53 also has, therein, the transfer robot 53R. The transfer robot 53R is capable of directly or indirectly receiving a wafer from the transfer robot 52R in the load-lock chamber 52 and transferring the wafer to any one of the chambers 54A to 54F, and is also capable of taking the wafer out of any one of the chambers 54A to 54F and transferring the wafer to the transfer robot 52R. Further, the transfer robot 53R is capable of passing and receiving the wafer from one of the chambers 54A to 54F to another.

The chambers 54A to 54F have, therein, a support table (not illustrated) on which the wafer is supported. One or more of the chambers 54A to 54F may be an etching chamber and the others may be, for example, an ashing chamber or a thin film deposition chamber. Such a configuration enables, for example, the etching process, a resist film removal process, a thin film deposition process to be performed in a single step. On the other hand, all of the chambers 54A to 54F may be etching chambers. This enables the etching process to be performed on a plurality of wafers in parallel, which enables the etching process with high throughput. The chambers 54A to 54F are connected to a gas supply system that supplies various types of gas depending on the process to be performed in the chamber.

Further, each of the chambers 54A to 54F is connected, for example, to a turbo molecular pump (not illustrated), and an exhaust pipe of the turbo molecular pump is connected to dry pumps 55A to 55F. The dry pumps 55A to 55F have exhaust pipes including flow path changeover valves 33A to 33F, respectively. Each of the flow path changeover valves 33A to 33F has one intake port and two exhaust ports as with the flow path changeover valve 33 of the substrate processing apparatus 1 according to the embodiment. Thus, the flow path changeover valves 33A to 33F are capable of switching between flow paths that lead emission gas from the dry pumps 55A to 55F to the gas regenerator 37 and flow paths that lead the emission gas to the detoxification device 39. The gas regenerator 37 separates Kr gas from the emission gas to discharge the Kr gas into the recovery container, and discharges the residual gas into the detoxification device 39.

Further, the substrate processing apparatus 50 includes controllers 401 and 402 configured in a manner similar to that in the controller 40 of the substrate processing apparatus 1. The controllers 401 and 402 are electrically connected to each other and capable of sending and receiving information on both the devices. The controller 402 collectively controls the substrate processing performed in the substrate processing apparatus 50 on the basis of the processing recipe, and the controller 401 acquires information on gas supply from the controller 401, and controls separation and recovery operation of Kr gas on the basis of the information acquired. Either one of the controllers 401 and 402 may collectively control the substrate processing including the separation and recovery operation of Kr gas.

Specifically, the controller 401 acquires processing recipes corresponding to the chambers 54A to 54F from the processing recipe that is set, in the controller 402, for the entire substrate processing apparatus 50. The controller 401 sets the Kr gas recovery step for the process of each of the chambers 54A to 54F to start the Kr gas recovery step, and the emission gas from the chambers 54A to 54F is led to the gas regenerator 37. When steps other than the Kr gas recovery step start, the emission gas reaches the detoxification device 39 without flowing into the gas regenerator 37. In this way, also in the substrate processing apparatus 50 according to the first modification, the substrate processing method described above is applicable to the chambers 54A to 54F. Thus, effects similar to those in the substrate processing apparatus 1 according to the embodiment are achieved.

(Second Modification)

Figure 6:
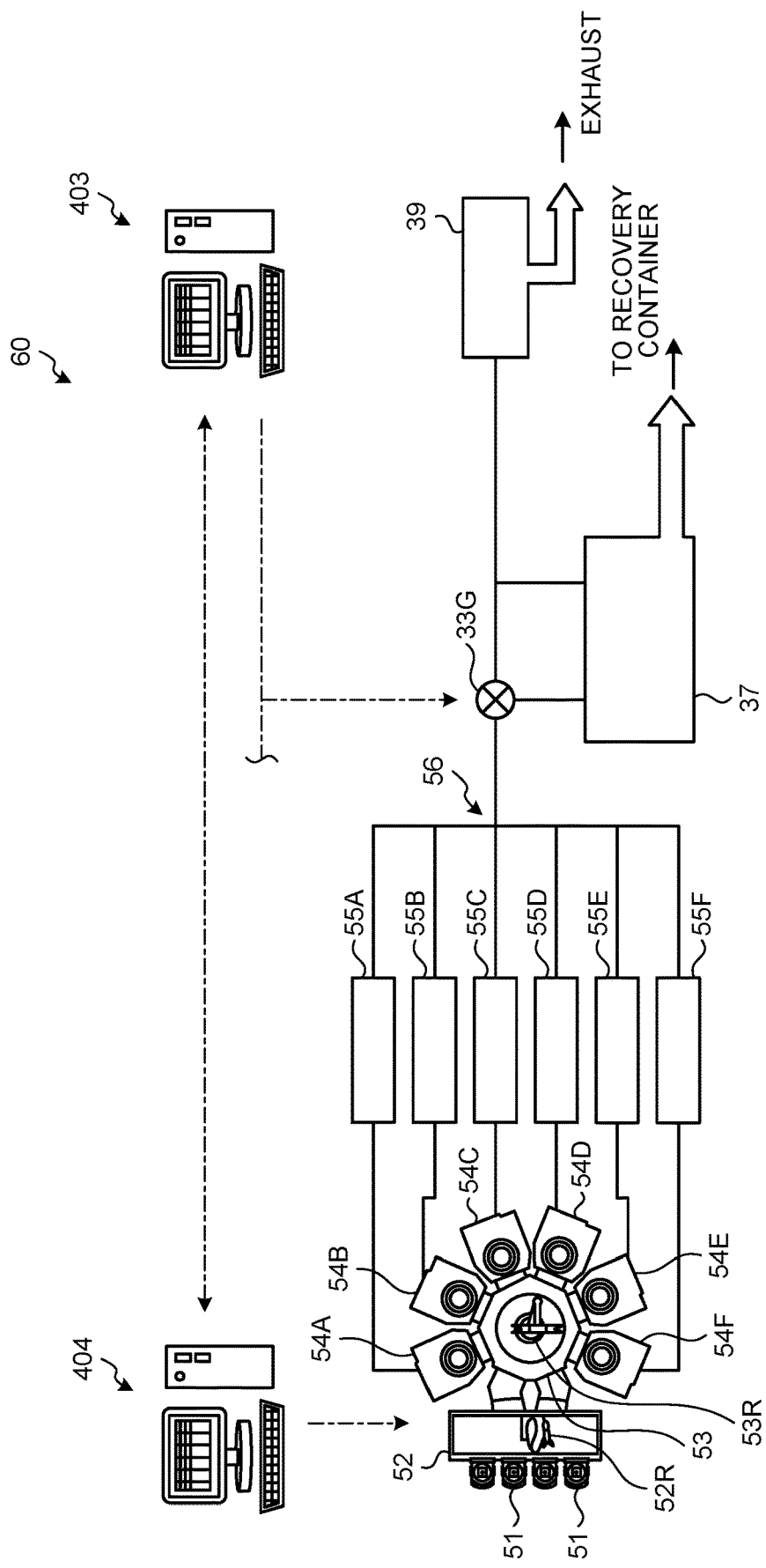
FIG. 6 is a schematic diagram illustrating a substrate processing apparatus according to a second modification.

The description goes on to a substrate processing apparatus 60 according to a second modification to this embodiment. FIG. 6 is a schematic diagram illustrating the substrate processing apparatus 60 according to the second modification. As illustrated, the substrate processing apparatus 60 is also a cluster tool as with the substrate processing apparatus 50. However, in the substrate processing apparatus 60, the exhaust pipes of the dry pumps 55A to 55F are connected to a connector pipe 56 and combined into one pipe, and the pipe is provided with a flow path changeover valve 33G. As with the flow path changeover valve 33 of the substrate processing apparatus 1, the flow path changeover valve 33G has one intake port and two exhaust ports. Except for the configuration (and configuration modified accordingly), the substrate processing apparatus 60 has similar configuration to that of the substrate processing apparatus 50. A controller 403 corresponds to the controller 401 of the substrate processing apparatus 50, and the controller 404 corresponds to the controller 402 of the substrate processing apparatus 50. Descriptions of other configurations that are similar to those of the substrate processing apparatus 50 are omitted.

In the substrate processing apparatus 60 according to the second modification, gas discharged from all the chambers 54A to 54F joins at the connector pipe 56; therefore, instead of applying the substrate processing method, described with reference to FIG. 3, to the chambers 54A to 54F, the controller 403 can create, for example, a time chart for Kr gas on the basis of the processing recipe set in the controller 404. To be specific, the controller 403 can create a time chart in which to record a ratio (Kr gas flow rate ratio) of the total flow rate of Kr gas to the total flow rate of gas supplied to the chambers 54A to 54F with respect to the time axis. In a case where a predetermined Kr gas flow rate ratio lasts for a predetermined period of time, the period of time can be set for the Kr gas recovery step on the basis of the time chart.

In the Kr gas recovery step, the emission gas joining at the connector pipe 56 is guided to the gas regenerator 37 by the flow path changeover valve 33, and Kr gas is separated and recovered in the gas regenerator 37. At a time other than the Kr gas recovery step, the emission gas joining at the connector pipe 56 flows not into the gas regenerator 37 but into the detoxification device 39 by the flow path changeover valve 33. This can also provide similar effects to those provided by the substrate processing method described above. Further, the substrate processing apparatus 60 according to the second modification can be configured in a simple manner because the flow path changeover valve (33) is not provided for each of the chambers 54A to 54F.

(Other Modification)

In the description of the substrate processing method according to the embodiment, a standard utilization rate is determined and a step of utilization rate that is equal to or greater than the standard utilization rate is set as the Kr gas recovery step; however, the present invention is not limited thereto. Another configuration is possible in which Kr gas usage is determined for each processing step of the recipe RP, standard usage is determined on the basis thereof, and a step of usage that is equal to or greater than the standard usage is set as the Kr gas recovery step. In the example of FIG. 2, for example, if the standard usage is set at 150 cc, then processing Steps No. 6, 10, and 15 can be set as the Kr gas recovery step. Then, in the case of executing processing Steps No. 6, 10, and 15, the flow path changeover valve 33 establishes the flow path A and the gas regenerator 37 separates Kr gas from emission gas and recovers the KR gas. Further, in a processing step other than the processing steps, the flow path changeover valve 33 establishes the flow path B, which allows the emission gas to flow into the detoxification device 39 without flowing into the gas regenerator 37. This also makes it possible to obtain a target amount of recovery of Kr gas.

Further, the time chart described for the substrate processing apparatus 60 according to the second modification can be created in the substrate processing method used in the substrate processing apparatus 1 according to the embodiment and the substrate processing apparatus 50 according to the first modification. In other words, also in the substrate processing apparatuses 1 and 50, in a case where a predetermined rare gas flow rate ratio lasts for a predetermined period of time, the period of time may be set as the rare gas recovery step.

Further, in a case where rare gas diluted with hydrogen gas or nitrogen gas is used, it is of course that the concentration of the rare gas should be taken into account in the calculation of the flow rate ratio of the rare gas to the total flow rate, the usage, the total usage, and the utilization rate of the rare gas.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A gas regeneration method comprising:
setting a predetermined standard on a basis of a flow rate of rare gas set in a processing recipe;
selecting a rare gas recovery step on a basis of the predetermined standard;
in the rare gas recovery step, guiding emission gas from a predetermined chamber to a rare gas regenerator, and separating a rare gas from the emission gas at the rare gas regenerator to collect the rare gas through a recovery pipe in a recovery container and to discharge the separated emission gas through an exhaust pipe to an outside; and
in a step other than the rare gas recovery step, causing the emission gas to bypass the rare gas regenerator to discharge the emission gas to the outside, wherein
setting the predetermined standard includes
determining rare gas usage for each step of the processing recipe,
adding up the rare gas usage for each step to determine total usage,
calculating a utilization rate of the usage for each step to the total usage, and
setting a standard utilization rate on a basis of the calculated utilization rate, and selecting the rare gas recovery step includes
selecting, as the rare gas recovery step, a step in which the utilization rate is equal to or greater than the standard utilization rate, and not selecting, as the rare gas recovery step, a step in which the utilization rate is smaller than the standard utilization rate.

2. A substrate processing method comprising:
carrying a substrate to be processed into a chamber; and
executing the gas regeneration method according to claim 1 in a case where processing is applied to the substrate in accordance with process parameters set in the processing recipe.

3. A gas regeneration method comprising:
setting a predetermined standard on a basis of a flow rate of rare gas set in a processing recipe;
selecting a rare gas recovery step on a basis of the predetermined standard;
in the rare gas recovery step, guiding emission gas from a predetermined chamber to a rare gas regenerator, and separating a rare gas from the emission gas at the rare gas regenerator to collect the rare gas through a recovery pipe in a recovery container and to discharge the separated emission gas through an exhaust pipe to an outside; and
in a step other than the rare gas recovery step, causing the emission gas to bypass the rare gas regenerator to discharge the emission gas to the outside, wherein
setting the predetermined standard includes
determining rare gas usage for each step of the processing recipe, and
determining standard usage on a basis of the rare gas usage, and
selecting the rare gas recovery step includes
selecting, as the rare gas recovery step, a step in which the rare gas usage is equal to or greater than the standard usage, and not selecting, as the rare gas recovery step, a step in which the rare gas usage is smaller than the standard usage.

4. A substrate processing method comprising:
carrying a substrate to be processed into a chamber; and
executing the gas regeneration method according to claim 3 in a case where processing is applied to the substrate in accordance with process parameters set in the processing recipe.

5. A gas regeneration method comprising:
setting a predetermined standard on a basis of a flow rate of rare gas set in a processing recipe;
selecting a rare gas recovery step on a basis of the predetermined standard;
in the rare gas recovery step, guiding emission gas from a predetermined chamber to a rare gas regenerator, and separating a rare gas from the emission gas at the rare gas regenerator to collect the rare gas through a recovery pipe in a recovery container and to discharge the separated emission gas through an exhaust pipe to an outside; and
in a step other than the rare gas recovery step, causing the emission gas to bypass the rare gas regenerator to discharge the emission gas to the outside, wherein
setting the predetermined standard and selecting the rare gas recovery step include
in a case where a predetermined rare gas flow rate ratio lasts for a predetermined period of time, setting the period of time in the rare gas recovery step on a basis of the flow rate of the rare gas set in the processing recipe.

6. A substrate processing method comprising:
carrying a substrate to be processed into a chamber; and
executing the gas regeneration method according to claim 4 in a case where processing is applied to the substrate in accordance with process parameters set in the processing recipe.

7. A substrate processing apparatus comprising:
a chamber;
a gas supply system connected to the chamber;
a gas exhaust system connected to the chamber; and
a controller that controls the gas supply system and the gas exhaust system, wherein
the gas exhaust system includes
a first flow path,
a second flow path,
a flow path changer that switches between a first state in which the chamber communicates with the first flow path and a second state in which the chamber communicates with the second flow path, and
a rare gas regenerator provided in the first flow path, the rare gas regenerator being connected through a recovery pipe to a recovery container, the rare gas regenerator being connected through an exhaust pipe to an outside, wherein
the controller is configured to set a predetermined standard on a basis of a flow rate of rare gas set in a processing recipe, to select a rare gas recovery step on a basis of the predetermined standard, and to control the flow path changer to guide the emission gas to the rare gas regenerator in the rare gas recovery step and to cause the emission gas to bypass the rare gas regenerator in a step other than the rare gas recovery step.

8. The substrate processing apparatus according to claim 7, wherein
the controller determines rare gas usage for each step of the processing recipe, adds up the rare gas usage for each step to determine total usage, calculates a utilization rate of the usage for each step to the total usage, sets a standard utilization rate on a basis of the utilization rate calculated, and sets the predetermined standard, and the controller selects, as the rare gas recovery step, a step in which the utilization rate is equal to or greater than the standard utilization rate, and does not select, as the rare gas recovery step, a step in which the utilization rate is smaller than the standard utilization rate.

9. The substrate processing apparatus according to claim 7, wherein the controller determines rare gas usage for each step of the processing recipe, determines standard usage on a basis of the rare gas usage, and sets the predetermined standard, and the controller selects, as the rare gas recovery step, a step in which the rare gas usage is equal to or greater than the standard usage, and does not select, as the rare gas recovery step, a step in which the rare gas usage is smaller than the standard usage.

10. The substrate processing apparatus according to claim 7, wherein, in a case where a predetermined rare gas flow rate ratio lasts for a predetermined period of time, the controller sets the period of time in the rare gas recovery step on a basis of the flow rate of the rare gas set in the processing recipe.

\* \* \* \* \*